United States Patent [19]

Epple

[11] 3,906,621

[45] Sept. 23, 1975

[54] METHOD OF CONTACTING A SEMICONDUCTOR ARRANGEMENT

[75] Inventor: Richard Epple, Schwaigern, Germany

[73] Assignee: Licentia Patent-Verwaltungs-G.m.b.H., Frankfurt, Germany

[22] Filed: Dec. 3, 1973

[21] Appl. No.: 421,166

[30] Foreign Application Priority Data

Dec. 2, 1972 Germany ............................ 2259133

[52] U.S. Cl. ...................................... 29/591; 29/588

[51] Int. Cl.² ............................................ B01J 17/00

[58] Field of Search .......... 29/576 B, 588, 591, 589, 29/590, 576 S; 174/DIG. 3

[56] References Cited

UNITED STATES PATENTS

| | | | |
|---|---|---|---|
| 3,113,896 | 12/1963 | Mann | 29/576 B |
| 3,258,898 | 7/1966 | Garibotti | 29/576 B |
| 3,494,022 | 2/1970 | Maute | 29/588 |
| 3,718,969 | 3/1973 | Segerson | 29/588 |
| 3,719,566 | 3/1973 | King | 29/588 |
| 3,842,492 | 10/1974 | Kamerbeek | 29/588 |

*Primary Examiner*—W. Tupman
*Attorney, Agent, or Firm*—Spencer & Kaye

[57] ABSTRACT

A method of contacting a semiconductor arrangement which has a plurality of contact points comprises applying to the contact points a contact sheet coherent in the contact region, electrically conductively connecting the contact sheet to the contact points and thereafter dividing the contact sheet, at least in its coherent region, into contact strips.

6 Claims, 9 Drawing Figures

METHOD OF CONTACTING A SEMICONDUCTOR ARRANGEMENT

BACKGROUND OF THE INVENTION

The invention relates to a method of contacting a semiconductor arrangement with a plurality of contact points by means of contact strips.

Such a method is already known. In the known method a contact sheet is divided into contact strips or contact fingers, which are connected merely at the ends remote from the contacting points. Finally the ends of the contact strips which are not connected to each other are aligned with the contact points of the semiconductor arrangement to be contacted and are connected to the contact points by soldering or welding. After the soldering or welding the contact strips which are still connected at one end are completely separated from each other.

This known method has the disadvantage that the aligning of the contact strips with the individual contact points as well as the contact itself entail difficulties. This is especially the case if the individual contact points are only a very small distance from each other, which is less than, for examples, 100 μm.

SUMMARY OF THE INVENTION

It is an object of the invention to improve the known above described method.

According to a first aspect of the invention, there is provided a method of contacting a semiconductor arrangement with a plurality of contact points by means of contact strips, characterised in that a coherent contact sheet is applied to the contact points and is connected to the contact points in an electrically conductive manner and in that this contact sheet is divided into contact strips separated from each other at least in the contact region only after the contact.

According to a second aspect of the invention, there is provided a method of contacting a semiconductor arrangement having a plurality of contact points comprising applying a contact sheet which is coherent in the region to be engaged with said contact points of said semiconductor arrangement to said contact points, connecting said contact sheet to said contact points in an electrically conductive manner and thereafter dividing said contact sheet into contact strips at least in said coherent region.

BRIEF DESCRIPTION OF THE DRAWINGS

The invention will now be described in greater detail, by way of example, with reference to the drawings, in which.

DESCRIPTION OF THE PREFERRED EMBODIMENTS

Basically, in the case of a method of the type mentioned at the outset, the invention proposes that a coherent contact sheet is applied to the contact points and connected to the contact points in an electrically conductive manner and that this contact sheet is divided into contact strips separate from each other at least in the contact region, only after the contacting.

By the term contact sheet should be understood any suitable contact material in sheet or strip form. For the method in accordance with the invention there is provided a contact sheet, which, on contacting is either not slit at all or slit in such a manner that it is unslit at least in the contact region between the contact points and is thus coherent.

The invention may be advantageously used in the case of integrated switching circuits and above all in the case of complex switching circuits. Not only is the contacting of very close contact points facilitated or even made possible for the first time, but also a high contacting density can be achieved. A further advantage of the invention resides in the fact that it makes possible in addition to the soldering technology also the application of more favorable welding technology. Moreover the invention permits a complete automation of the contacting of complex switching circuits.

The separation of the contact sheet after the contacting into individual contact strips, also called contact fingers, is effected for example by a laser or electron beam treatment. The contact sheet is for example soldered or welded to the contact points. An electron beam is, as is well known, a physical instrument, which can be used with the smallest dimensions. In addition there exists the possibility of automating complicated operational processes by precise control or by electromagnetic deflection of the electron beam. In the case of relatively smaller beam energy, no material evaporation takes place but merely a welding of the materials to be connected to each other.

The laser beam, which has a substantially greater wavelength than the electron beam, does indeed not permit the working of such small dimensions as the electron beam, but the deminsions which can be processed with a laser beam are still within the order of magnitude of 1 μm and thus small enough in order to enable substantial technical progress as compared with known techniques even with laser beams. As compared to the electron beam, the laser beam does not require a vacuum, which makes a more simple mode of operation possible and demands less expenditure with regard to equipment.

Figures 1, 2:
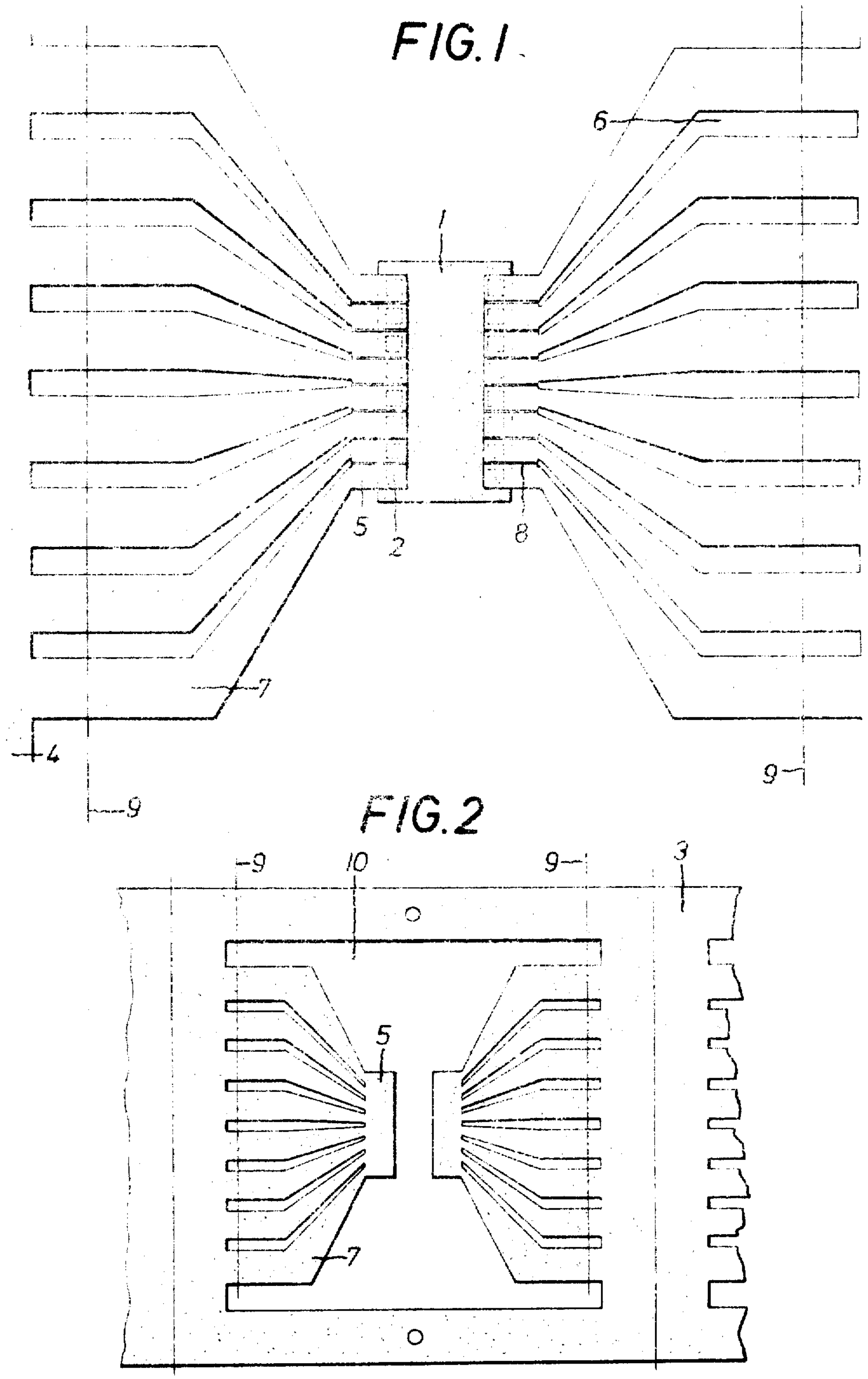
FIG. 1 is a view showing the contacting of an integrated circuit with the aid of a contact sheet.
FIG. 2 is a view of the contact sheet used in FIG. 1 but prior to contacting.

Referring now to the drawings, FIG. 1 shows the contacting of an integrated circuit with the help of a contact sheet according to the invention. The circuit to be contacted comprises the semi-conductor wafer 1, in which the individual switch elements are located. The contact spot or electrode 2 to be contacted is located on the surface of the semiconductor wafer. The contacting of the contact spot 2 and thus of the integrated circuit is effected with the help of a contact sheet 3, in which the regions 4 and 5 have to be differentiated. As FIG. 1 shows, the region 4 is wider as compared with the region 5 and, contrary to the region 5, is already provided with slits 6 before the contacting. Since the region 4 is wider than the region 5 and, as compared with the region 5, does not serve for the direct contacting of the very closely adjacent contact spots 2, the slits 6 can be constructed substantially wider in the region 4 of the contact sheet 3 than in the region 5 and, e.g. may be produced by stamping out before contacting.

As opposed to the region 4, the region 5 of the contact sheet 3 is still unslit before contacting and is thus coherent or still not divided into contact fingers. The region 5 which is still connected together at first is designed simply for contacting on the contact spots 3 and is soldered or welded to the contact spots. Since the region 5 of the contact sheet 3 is not slit before contacting as compared with the region 4, in the contacting there are still no contact fingers present in the contact region. Thus, contacting is substantially facilitated, since in the case of a coherent sheet any adjustment of very narrow contact fingers to extremely close contact spots is not necessary. Rather, merely an alignment of the unslit region 5 with the entire region of the contact sports 2 is necessary, which alignment is substantially more simple to undertake than the alignment of substantially narrower contact fingers. The division of the region 5 into the contact fingers 7 present already in the region 4 before the contact is effected in accordance with the invention only after contacting. The contact fingers 7 in the region 5 of the contact sheet 3, are, for example, produced by a laser or electron beam treatment, that is to say along the lines 8. The contact sheet generally comprises metal.

After contacting and after dividing of the region 5 into contact fingers 7, the contact fingers must finally be completely separated from each other in the region 4, that is to say, by a cut along the lines 9. The contacting in accordance with the invention is terminated after the complete separation of the contact sheet into contact fingers separated from each other. As already mentioned, either a completely unslit contact sheet or a contact sheet, which is already partially pre-slit, can be used for contacting. What is important for the invention is, in each case, that the division into contact fingers in the region of the points to be contacted takes place only after the bonding of the contact sheet to the contact points.

During the contacting of a semiconductor arrangement in accordance with FIG. 1 for the contact spots 2 located on the left on the semiconductor wafers and for the contact spots 2 located on the right on the semiconductor wafers 1 separate contact sheets 3 are used. FIG. 2 shows a contacting in accordance with the invention in which there is provided, for contacting the two sides of an integrated circuit, a common contact sheet 3, which has a recess 10 in the center. Also in the case of this contact sheet, the regions 4 are already preslit, i.e. provided with recesses, whereas the regions 5 provided for the direct contacting are unslit. FIG. 2 shows the contact sheet 3 before contacting. After contacting of the semiconductor wafer, not shown in FIG. 2, the regions 5 are likewise slit and subsequently cuts are made in the region 4 along the broken cut lines 9 whereby the individual contact strips 7 are completely separated from each other.

Figure 3:
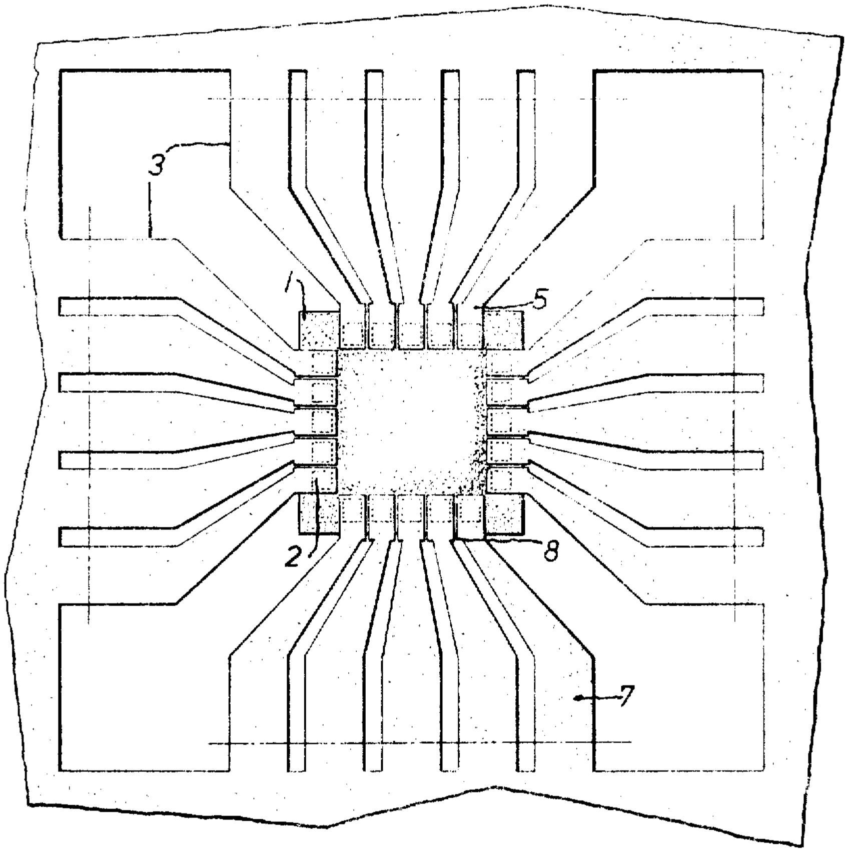
FIG. 3 is a view similar to FIG. 1 but showing contacting by means of a contact sheet to four sides of an integrated circuit.

In the case of the contacting according to FIG. 3, contacting takes place not only, as in the case of FIG. 1, on two-sides of the semiconductor wafers but on all sides of the semiconductor wafers using four contact sheets 3.

Figure 4:
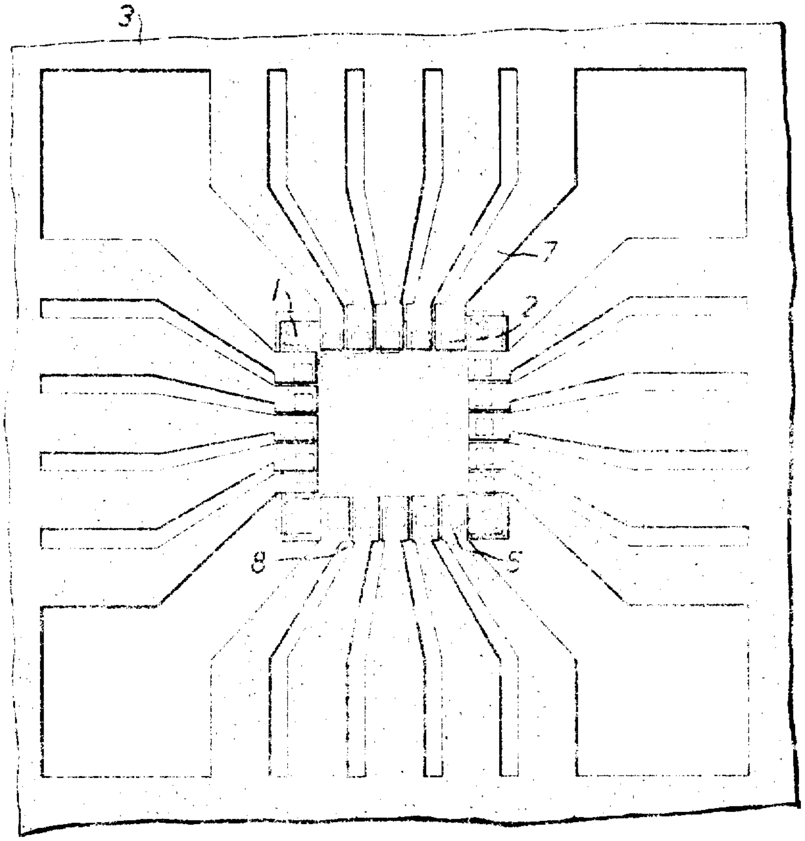
FIG. 4 is a view similar to FIG. 3 but showing permissible tolerances.

A substantial advantage of the invention is illustrated for example by FIG. 4. Whereas in the case of the known contact finger contacting an erroneous alignment in most cases has considerable consequences, a certain erroneous alignment can be put up with, as shown in FIG. 4, in accordance with the invention, since even in the case of an erroneous alignment which is not too large, the contact sheet can be soldered or welded to the contact points and only thereafter divided into individual contact fingers.

Figure 5:
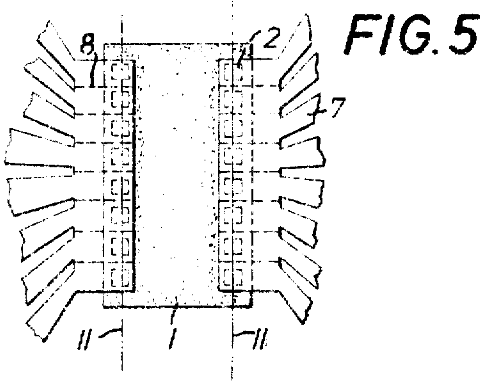
FIG. 5 is a view of a contacted integrated circuit showing the path of a laser or electron beam.

The laser or electron beam can be so controlled by a programmed computer that it produces one after the other in accordance with FIG. 5, the weld or solder contacts with the contact spots 2 as well as the separating lines 8 for the production of the contact fingers 7. The laser or electron beam must be guided, for contacting, firstly along the line 11, shown broken, and for the separation of the contact fingers 7, subsequently along the lines 8, likewise shown broken. However it is also possible to divide a laser or electron beam into a plurality of beams and especially to produce the spacing of the part-beams by adjusting suitable deflection means for each semiconductor wafer. In this way a substantial reduction in the lapse of time can be achieved.

The soldering-on or the welding-on process can be effected in the same operation as the separating operation, that is to say for example by means of laser or electron beams. Whether welding or soldering is to take place or whether it is going to be separated or slit, depends, in the case of radiation treatment, only on the appropriate radiation energy, which can be electrically controlled. As already expressed in FIG. 5, the lines 11 are the soldering or welding paths for contacting and the lines 8 are the separating paths.

FIGS. 6 to 9 relate to connecting technology for individual semiconductor wafers to form hybrid switching circuits. The mutual contacting of the individual semiconductor wafers is effected according to the method in accordance with the invention.

Figure 6:
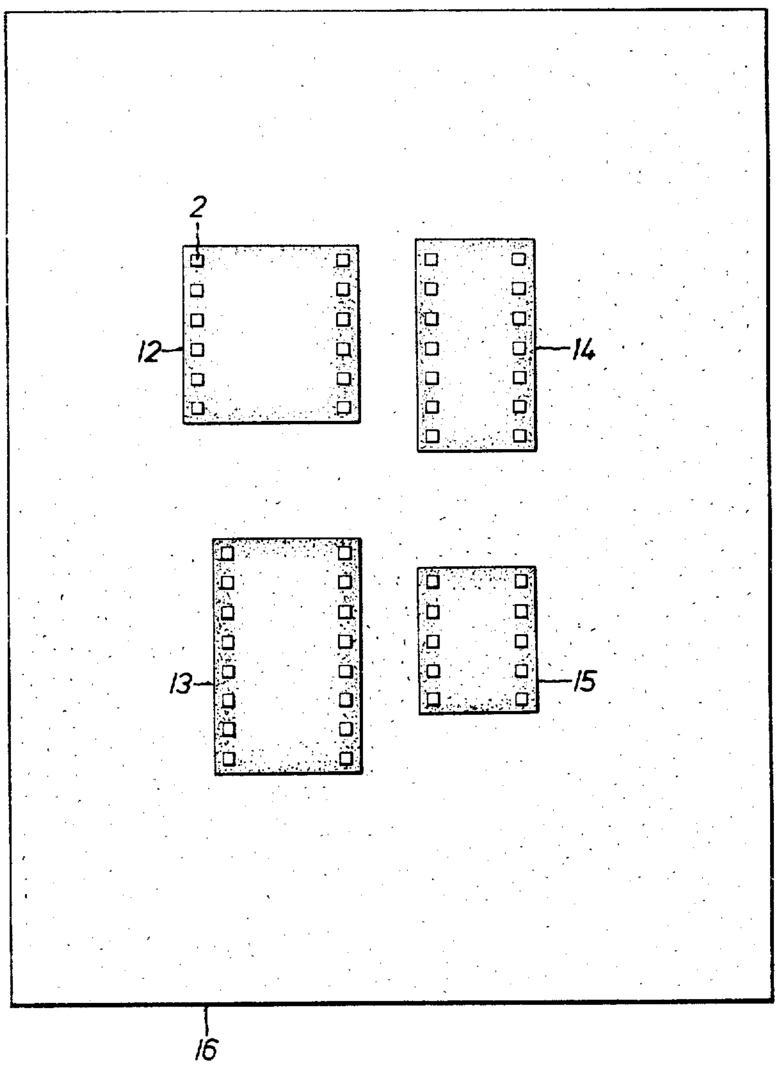
FIG. 6 is a view of four semiconductor wafers on a common substrate ready for contacting.

FIg. 6 shows four semiconductor wafers 12, 13, 14 and 15, to be connected to each other in accordance with the hybrid technique, on a common substrate 16. The common substrate 16 comprises, for example, a ceramic plate. The contact points 2 to be connected to each other are located on the individual semiconductor wafers. Since the position of the semiconductor wafers must be held accurately with respect to each other, their soldering to the common substrate is effected for example with the help of a jig, which has suitable recesses for the accommodation of the semiconductor wafers.

Figure 7:
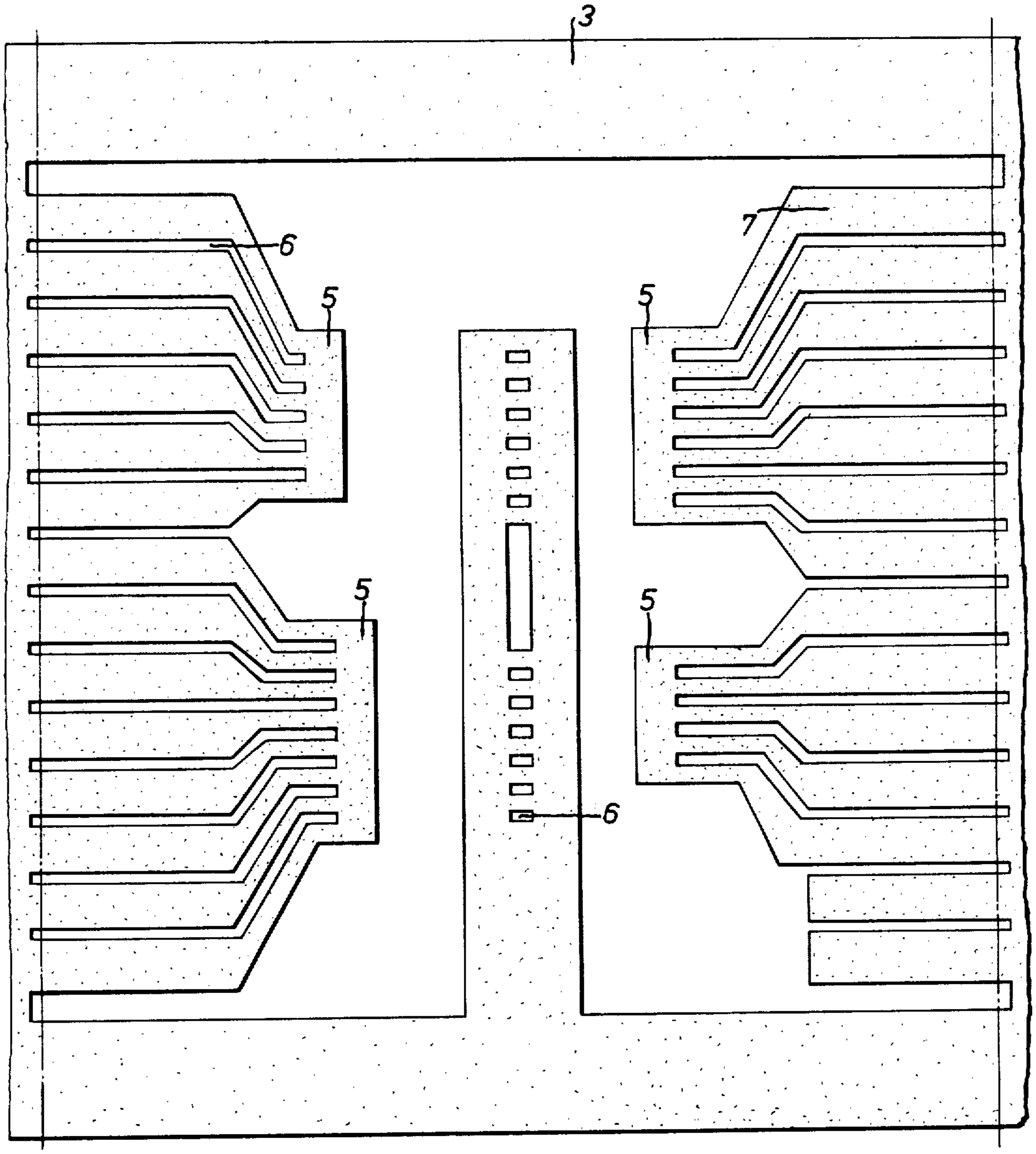
FIG. 7 is a view of the contact sheet necessary for contacting the wafers of FIG. 6.

FIG. 7 shows the contact sheet 3 provided for contacting a hybrid circuit in accordance with the invention. The contact sheet 3 is again partially preslit, whereas the regions 5 are unslit and thus are still connected together. The regions 5 of the contact sheet serve, as in the ppreceding exemplary embodiments, for the immediate contacting of the contact points. The division of the regions 5 into the contact fingers 7 is also effected only after the contacting. The slits already present before contacting are given the reference numeral 6 in FIG. 7.

Figure 8:
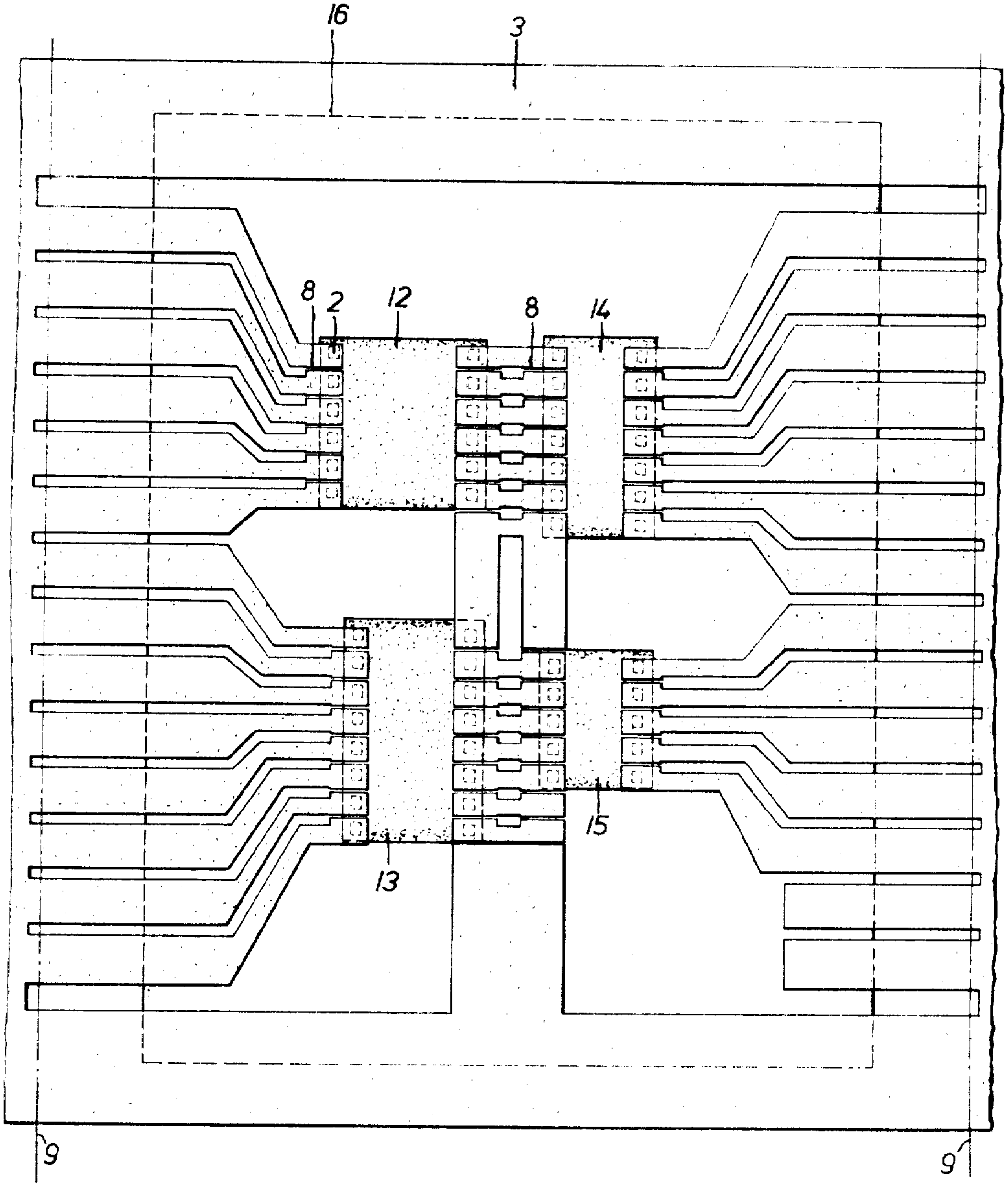
FIG. 8 is a view of the contact sheet of FIG. 7 contacting the wafers of FIG. 6.
Figure 9:
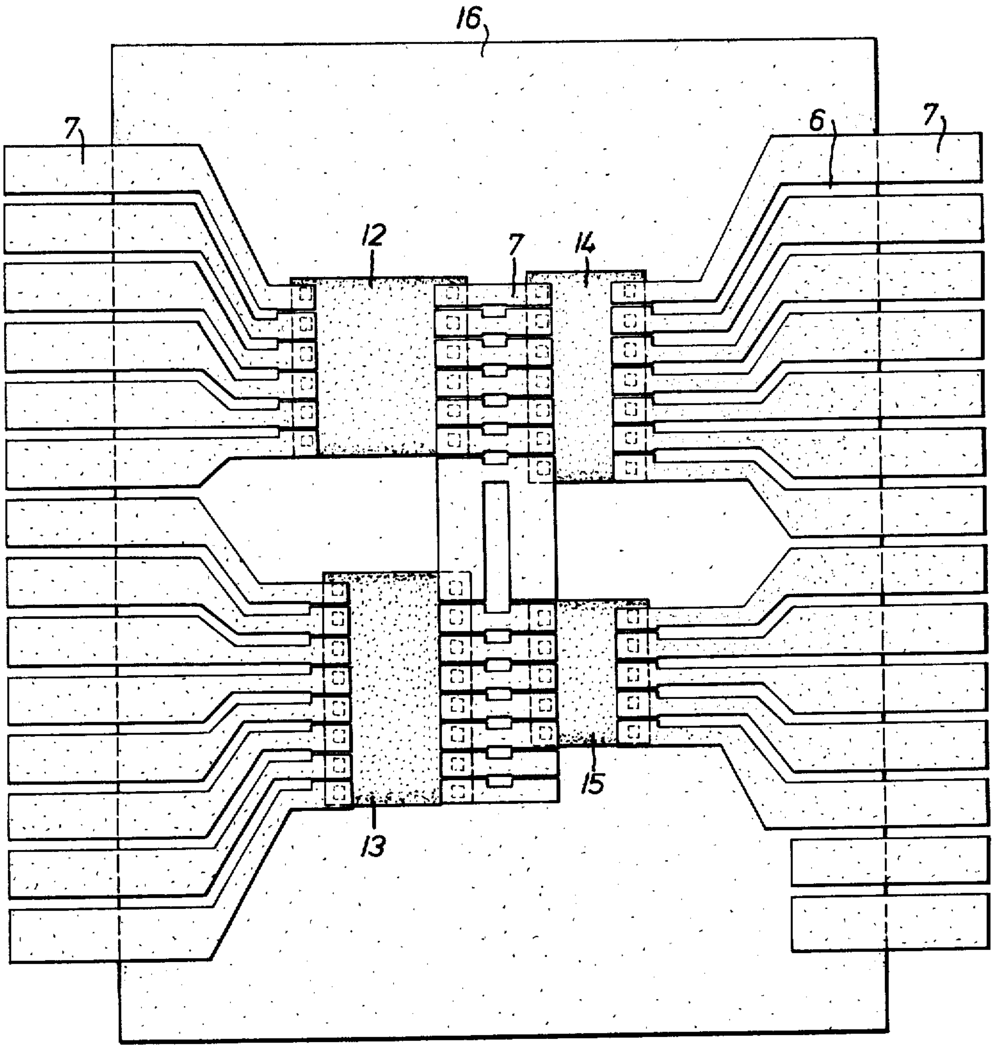
FIG. 9 is a view of the completed arrangement.

In FIG. 8 the contact sheet 3 is laid on the hybrid circuit comprising the ceramic plate 16 and the semiconductor wafers 12, 13, 14 and 15 and soldered to the contact spots 2. As FIG. 8 further shows, the contact sheet has been slit in addition after contacting along the separating lines 8, so that the contact strips 7 which connect the individual semiconductor wafers together are already extensively separated from each other and are slit connected to each other only at the edge of the contact sheet. In order to completely separate the contact fingers at the edge of the contact sheet further cuts finally take place along the lines 9 shown broken. FIG. 9 shows the finished hybrid circuit. Both contacting and the separation of the contact fingers or contact strips after the contacting in the contact region along the separating lines 8 (FIG. 8) is effected preferably again by a laser or electron beam treatment.

It will be understood that the above description of the present invention is susceptible to various modifications, changes and adaptations.

What is claimed is:

1. A method of contacting a semiconductor arrangement having a plurality of spaced contact points by means of contact strips comprising: providing a coherent contact sheet having a first region which is to engage said plurality of contact points and a further region which is to extend beyond the perimeter of said arrangement; placing said first region on said plurality of contact points; connecting said first region of said contact sheet to said plurality of contact points in an electrically conductive manner; and thereafter dividing said first and second regions of said contact sheet along lines of separation which extend between said spaced contact points and completely across said first and second regions to divide said contact sheet into individual contact strips separated from each other but connected to said contact points.

2. A method of contacting a semiconductor arrangement having a plurality of spaced contact points by means of contact strips comprising: providing a contact sheet having a plurality of spaced apart contact strips which terminate in an integrally connected coherent region wherein said coherent region is to be engaged with said contact points of said semiconductor arrangement, applying said coherent region to said plurality of contact points, connecting said coherent region of said contact sheet to said plurality of contact points in an electrically conductive manner, and thereafter dividing said coherent region along lines of separation which extend between said spaced contact points and completely across said coherent region and which terminate at the spaces between said strips to divide said contact sheet into individual contact strips separated from each other but connected to said contact points.

3. A method as defined in claim 2, wherein the division of the contact sheet into individual contact strips after the contacting is effected by a laser treatment.

4. A method as defined in claim 2, wherein the division of the contact sheet into individual contact strips after the contacting is effected by electron beam treatment.

5. A method as defined in claim 2, wherein the contact sheet is connected to the contact points of the semiconductor arrangement by soldering or welding.

6. A method as defined in claim 2, wherein integrated switch circuits located on a common substrate to form a hybrid switch circuit are mutually connected.

* * * * *